United States Patent [19]

Reimer

[11] Patent Number: 5,019,939
[45] Date of Patent: May 28, 1991

[54] THERMAL MANAGEMENT PLATE

[75] Inventor: William A. Reimer, Wheaton, Ill.

[73] Assignee: AG Communication Systems Corp., Phoenix, Ariz.

[21] Appl. No.: 427,272

[22] Filed: Oct. 24, 1989

[51] Int. Cl.⁵ .............................................. H05K 7/20
[52] U.S. Cl. ..................................... 361/386; 211/41; 361/388; 361/415
[58] Field of Search ............... 174/15.2, 16.3; 211/41; 165/80.2, 80.3, 80.4, 80.5, 104.33, 185; 361/383, 384, 379, 391, 385–388, 415, 396, 417, 419, 420

[56] References Cited

U.S. PATENT DOCUMENTS

| | | | |
|---|---|---|---|
| 3,231,785 | 1/1966 | Calabro | 361/382 |
| 4,318,157 | 3/1982 | Rank | 361/386 |
| 4,366,526 | 12/1982 | Lijoi | 361/385 |
| 4,702,535 | 10/1987 | Beun | 361/391 |
| 4,710,853 | 12/1987 | Reinhardt | 361/391 |
| 4,716,493 | 12/1987 | Zelkowitz | 361/383 |
| 4,821,149 | 4/1989 | Belanger, Jr. | 361/415 |
| 4,845,380 | 7/1989 | Piegari | 361/415 |
| 4,853,828 | 8/1989 | Penn | 361/386 |
| 4,867,235 | 9/1989 | Grapes | 361/388 |

Primary Examiner—Gerald P. Tolin
Attorney, Agent, or Firm—Robert J. Black; Gregory G. Hendricks

[57] ABSTRACT

A thermal management plate designed to take advantage of the thermally conductive path provided as an integral part of printed circuit board component assemblies. The plate is a shelf-like unit providing both thermal management of electronic assemblies and a mounting arrangement for assemblies. Manufactured of high conductive material, the unit includes a printed circuit board assembly locator, a thermal path and a series of finned surfaces on the front and rear to dissipate heat generated by components.

5 Claims, 3 Drawing Sheets

THERMAL MANAGEMENT PLATE

BACKGROUND OF THE INVENTION

1. Field of the Invention

The present invention relates to cooling of the electronic or telecommunications equipment and more particularly to a thermal management plate useful for mounting printed circuit board assemblies as well as providing heat dissipation.

2. Background Art

Historically, telecommunications and similar electronic equipment has been free convection cooled. Although the amount of heat that can be dissipated is relatively low, this has been acceptable because power dissipation densities typically were very low.

With increased power densities, forced convection (fan) cooling was introduced. Though satisfactory equipment cooling is provided by the forced convection method, this method has a number of drawbacks. These drawbacks include cost, being added in the form of fans, their necessary mounting hardware and the required failure detection circuitry that must be provided. The reliability of fans must be considered and accordingly appropriate maintenance techniques must be developed. Beacuse of the questionable reliability of fan devices, fan failure detection and alarm equipment must be provided if system degradation can result if and when a fan failure occurs. Finally, in many instances, acoustic noise is generated by the fan type devices and in many office environments such noise may be considered objectionable.

With the rapid expansion of miniaturization techniques in the electronics field, electronic systems have been constructed utilizing smaller and smaller components. While these components are smaller they individually dissipate more power than many of the larger components previously utilized. Thus, a desirable trend is to form the assembly of the printed circuit board and its related components with an arrangement that mounts and interconnects these components to provide a thermally conductive plane as an integral part of the unit. Accordingly it is the object of the present invention to provide a thermal management plate that allows the thermal coefficient of expansion of the component and its mountings to be matched as well as to improve local thermal management at a high power density device by conducting heat away from it.

SUMMARY OF THE INVENTION

The thermal management plate of the present invention is designed to take advantage of the thermally conductive path provided as an integral part of many printed circuit board component assemblies. Such printed wiring cards on which the components are mounted contain a conductive heat transfer surface—aluminum or copper sheet or plate. Through its use, heat is carried from the assemblies to the thermal management plate and via conduction heat transfer to the exterior of the basic electronics enclosure enclosing all of the printed circuit boards, where it is dissipated via convection and radiation heat transfer. The thermal management plate of the present invention offers the reliability of free convection heat transfer in that it is a "benign" approach requiring no power and with no associated failure rates that must be considered in this design.

A part of the present invention of the thermal management plate is a shelf-like unit that provides both for thermal management of electronic assemblies and a mounting arrangement for them. The thermal management plate is made of high conductivity materials and includes a series of finned surfaces to dissipate heat generated by the components.

In actual practice, printed circuit board assemblies are positioned between two thermal management plates. It will be obvious, therefore, that a given printed circuit board assembly is thermally conducting to two plates and the dissipation to the outside environment occurs at the four finned areas that protrude through the system enclosure. Because adjacent printed circuit board assemblies share common thermal management plates, the tendency will be to create an iso-thermal condition through conductive coupling. If the distance between the printed circuit board assembly and the outside of the enclosure is relatively large, or the thermal conductivity of the thermal management plate is not sufficient to conduct the heat to the fins, heat pipes may be incorporated in the thermal management plate structure. This arrangement would allow the amount of metal utilized in the thermal management plate to be reduced, thus lowering costs and weight without sacrificing thermal management.

DESCRIPTION OF THE PREFERRED EMBODIMENT

Figure 1:
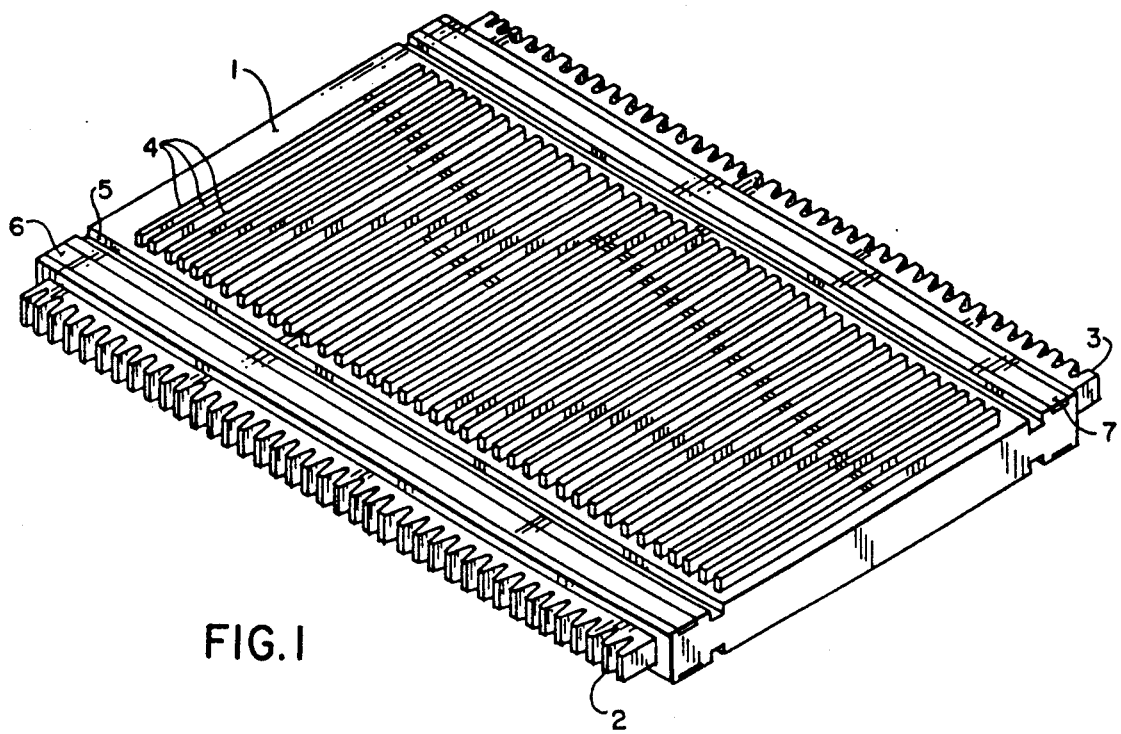
FIG. 1 is a perspective view of a thermal management plate in accordance with the present invention.
Figure 2:
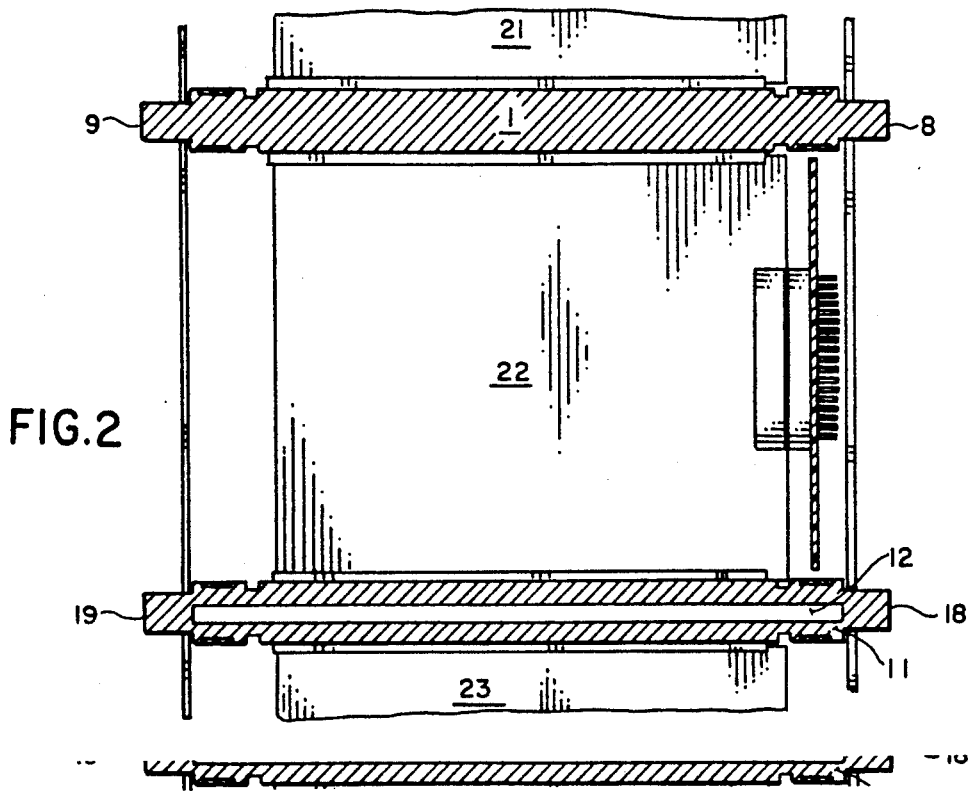
FIG. 2 shows the method of utilization of thermal management plates in accordance with the present invention to provide the necessary support and mounting as well as cooling advantages for printed circuit boards in accordance with the present invention.

Referring now to FIG. 1, the thermal management plate 1 of the present invention is a shelf-like unit providing both for thermal management of electronic assemblies and as well as a mounting arrangement for them. In this manner it functions similar to a card file. The thermal management plate of the present invention may be manufactured of high conductive material, such as aluminum, and provides both locator and thermal paths for printed circuit board assemblies.

A series of finned surfaces 2 and 3 located at the front and rear, respectively, are provided to dissipate heat generated by the components mounted on the associated printed circuit board assemblies for which the thermal management plate 1 provides mounting.

Also included in the thermal management plate 1 are a plurality of printed circuit board assembly locator and thermal path connectors, such as 4, an optional latching groove, such as 5, may also be included as well as thermal insulators 6 and 7.

In practice, printed circuit board assemblies, such as 21, 22, and 23, are positioned between thermal management plates, such as 1 and 11. Obviously, therefore, a given, printed circuit board assembly, such as 22, is shown as thermally conducting to two plates (1 and 11) and the heat dissipation to the outside environment occurs at the four finned areas 8, 9, 18 and 19, respectively. Because adjacent printed circuit board assemblies share common thermal management plates, the tendency would be to create an iso-thermal condition through conductive coupling. Thus, if the distance between the printed circuit board assembly and the outside of the enclosure is relatively large, or the thermal conductivity of the thermal management plate is insufficient to conduct heat to the fins, it may be useful to insert heat pipes 12 that may be incorporated into the thermal management plate structure, base plates. This would permit the amount of metal used in the thermal management plate to be reduced thus reducing cost and weight without sacrificing the necessary thermal management.

Figure 3:
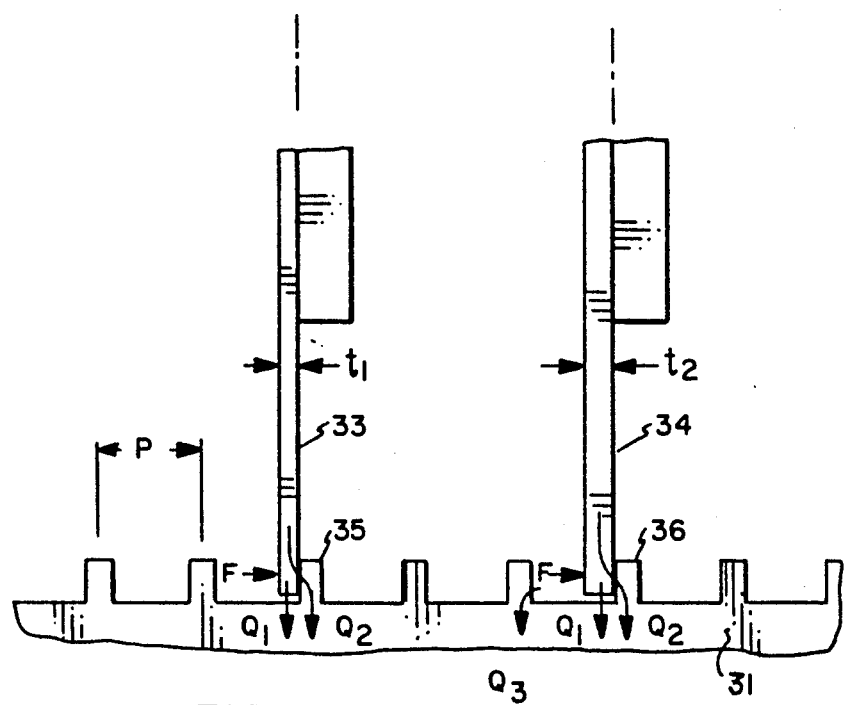
FIG. 3 is a partial sectional view of a portion of a thermal management plate in accordance with the present invention showing installation of a pair of printed circuit boards and the thermal conductivity paths established thereby.

The thermal management plate of the present invention relies on forming a good conductive coupling between the printed circuit board assembly and the thermal management plate as may be seen by reference to FIG. 3. In FIG. 3, a portion of a thermal management plate 31 is shown with two printed circuit board assemblies 33 and 34 mounted thereon. To ensure good conductive coupling, the printed circuit board assemblies, such as 33 and 34, rest against a combination locator and thermal path unit, such as 35 and 36, respectively, on one surface only. This arrangement is unlike conventional card guides that are designed to loosely entrap a printed circuit board assembly. The surface of engagement between a printed circuit board assembly 33 and the locator and thermal conductive path unit 35 is critical, but ensured by having the locator have a machined surface that represents a reference plane. By establishing a reference plane to the surface of the printed circuit board assembly connector, good conductive contact between the printed circuit board assemblies is guaranteed regardless of the thickness of the printed circuit board assembly. These are shown by the indicies $t_1$ and $t_2$ in FIG. 3. Through the application of a force F, the surface of the printed circuit board assembly, such as 33 and 34, is driven against the associated locator, such as 35 and 36, establishing a major heat conductive path Q2 in the upper and lower plates. Additional a minor path Q1 is also established by the printed circuit board assembly by virtue of its resting on the lower plate portion of the thermal management plate 31. The distance between printed circuit board assembly locators, such as P, is chosen to allow force F to be applied and to allow at the same time minimum printed circuit board assembly spacing. For example, if the minimum of printed circuit board assembly spacing is 0.500", P may be chosen at 0.250" to allow printed circuit board assembly spacings of any 0.250" multiple.

Figure 4:
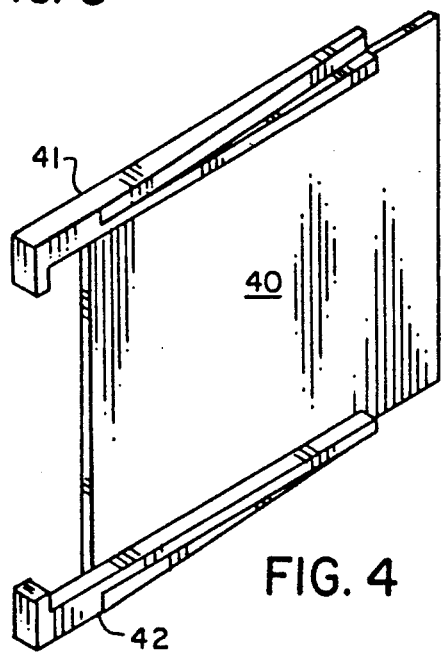
FIG. 4 is a perspective view showing the apparatus utilized for mounting printed circuit board assemblies to thermal management plates in accordance with the present invention.
Figure 5:
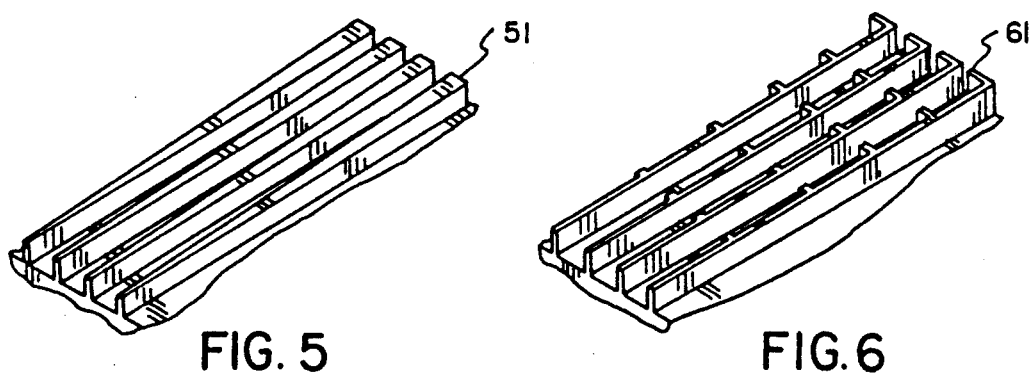
FIG. 5 is a partial perspective view of the portion of a thermal management plate in accordance with the present invention showing a particular technique for accepting printed circuit board assemblies with their associated mounting hardware.
Figure 6:
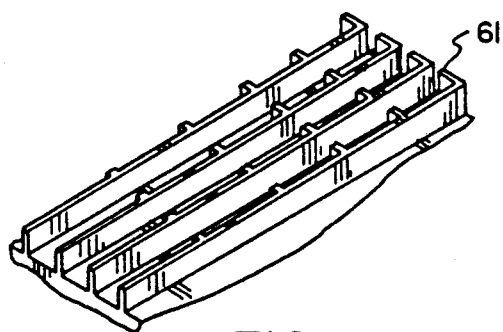
FIG. 6 is an partial perspective view of an alternate version of a portion of a thermal management plate in accordance with the present invention showing the means for receiving the printed circuit board assembly and the associated wedge and lock hardware taught by the present invention.

Referring now to FIGS. 4, 5 and 6, a variety of mechanical means may be used to force the printed circuit board assembly against its associated locator. A self-locking wedge approach, as shown in FIG. 4, provides a number of advantages when used to provide this force. The wedges, such as 41 and 42, mounted directly on the printed circuit board assembly card 40 and a permit a limited sliding motion with respect to the printed circuit board assembly. The taper on the wedge is matched by the taper on the printed circuit board locator, as is present in wedges 51, ect., as shown in FIG. 5. Thus, after the printed circuit board assembly is inserted into its associated backplane connector, the wedges are slid to engage both an unused printed circuit board assembly locator, such as 51, and the card. The resulting wedging action creates an intimate contact between the printed circuit board assembly and the locator it shares a reference plane with. If the sliding wedge is formed from a thermally conductive material, another heat path is then created between the thermal management plate locator it is wedging against and the printed circuit board assembly, as shown as Q3 in FIG. 3. The taper of the wedge is chosen so that the wedge is self-locking and acts as a lock to the printed circuit board assembly.

An alternate version of locator construction is shown in FIG. 6 in which the locator taper is affected by a number of contact ridges of varying heights arranged in a wedge-like configuration.

Figure 7:
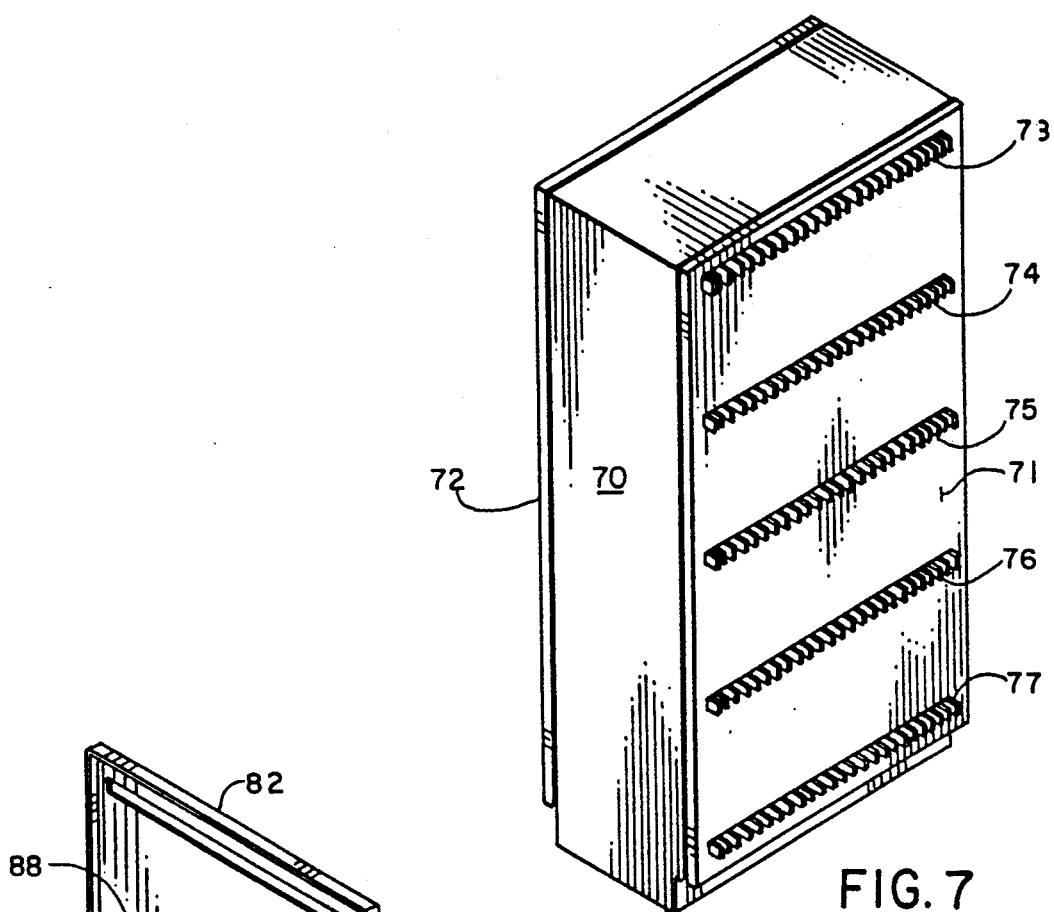
FIG. 7 is a perspective view of an enclosure for printed circuit board assemblies and thermal management plates in accordance with the present invention.

An enclosure in which the thermal management plates in accordance with the present invention are mounted is shown in FIG. 7. The enclosure 70 is designed to allow finned areas, such as 73, 74, 75, 76 and 77, to extend through the enclosure door 71. In this manner heat can be dissipated to the surrounding environment by convection and radiation heat transfer. It may be possible because of particular engineering requirements that the configuration of the thermal management plate extending from the front of the enclosure may be different from that of the rear. It may be desirable to configure the thermal management plate so the greatest temperatures appear at the rear where the finned areas can be much larger because the printed circuit board assemblies do not have to be inserted passed them and the front is relatively cool with a minimum appearance impact.

Figure 8:
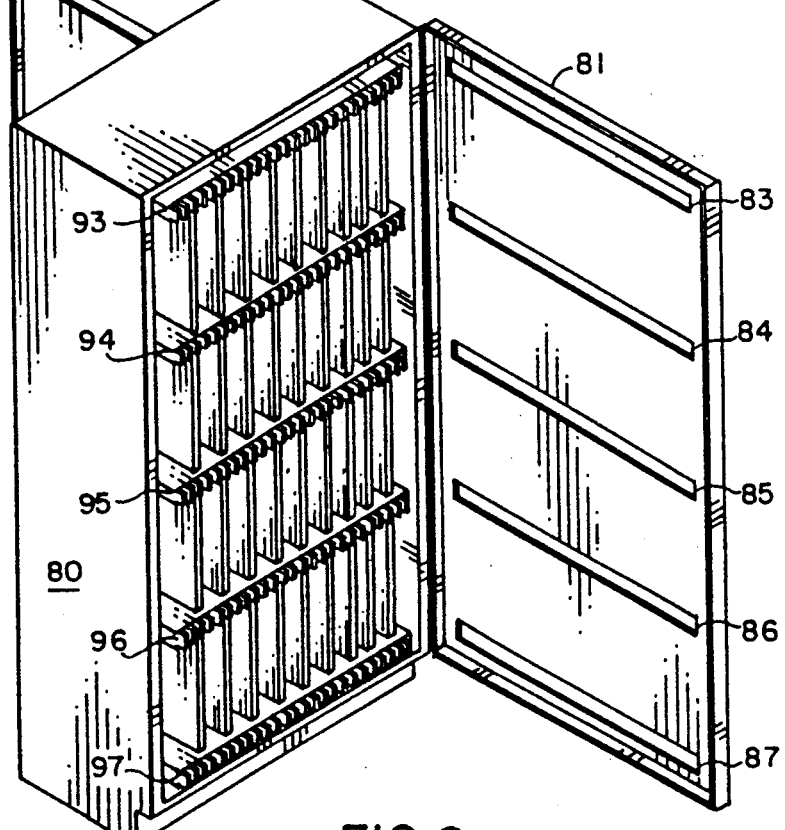
FIG. 8 is a perspective view of an enclosure for mounting printed circuit board assemblies and thermal management plates in accordance with the present invention with the door shown in the open position to effectively view the approximate location of printed circuit boards and their related thermal management assemblies.

Reference to FIG. 8 shows a similar enclosure 80 with doors 81 and 82 in the open positions and by way of openings, such as 83, 84, 85, 86, 87 and 88. The finned areas of thermal management plates, such as 93, 94, 95, 96, 97 (when doors 81 and 82 are closed) project through the respective openings.

From the foregoing it will be apparent that benign, high reliability conduction, convection and radiation heat transfer means are provided by the present invention to cool electronic components. Because of the included design, assemblies of various thicknesses can be easily accommodated. Selective electromagnetic induction shielding can also be provided to reduce the cost of such shielding. It should also be noted that through the use of heat pipes in the plate and a rear enclosure door containing liquid cooling tubes, a zoned, heat dissipation assembly could be obtained where conductivity problems are even greater than those envisioned by the basic concept, can be solved.

While but a single embodiment of the present invention has been shown it will be obvious to those skilled in the art that numerous modifications may be made without departing from the spirit of the present invention which shall be limited only by the scope of the claims appended hereto.

What is claimed is:

1. A thermal management plate to provide support for printed circuit board assemblies and for conduction of thermal energy from said assemblies to the environment, said plate comprising:
   a base of thermal energy conductive material, including top and bottom surfaces and front and rear edges;
   a plurality of thermal energy conductive printed circuit board assembly locator elements mounted on at least one of said surfaces;
   said locator elements each configured to provide thermal energy conductive coupling between a printed circuit board assembly and said thermal management plate;
   each of said locator elements including a machined surface to make contact with a printed circuit board assembly;
   each of said printed circuit board assembly locator elements including a plurality of projections of diminishing lengths to provide an overall wedge-like configuration adapted to assist in forcing a printed circuit board assembly against the machined surface of one of said locator elements;
   thermal energy dissipating fins located on at least one of said edges;
   whereby thermal energy generated by said printed circuit board assemblies supported by said thermal management plate is conducted via said locator elements, to said base then via said fins to the environment.

2. A thermal management plate as claimed in claim 1 wherein:
   said plate is constructed of aluminum.

3. A thermal management plate as claimed in claim 1 wherein:
   a plurality of thermal energy conductive printed circuit board assembly locator elements are mounted to each of said surfaces.

4. The thermal management plate as claimed in claim 1 wherein:
   thermal energy dissipating fins are located on both said front and said rear edges.

5. A thermal management plate as claimed in claim 1 wherein:
   said base further includes a heat pipe for conduction of cooling liquid.

* * * * *